United States Patent [19]

Lee et al.

[11] Patent Number: 5,289,421
[45] Date of Patent: Feb. 22, 1994

[54] DYNAMIC RANDOM ACCESS MEMORY WITH LOW NOISE CHARACTERISTICS

[75] Inventors: Jin-Hyo Lee; Kyu-Hong Lee, both of Daejeon, Rep. of Korea

[73] Assignees: Korea Electronics and Telecommunications Research Institute; Korea Telecommunications Authority, Rep. of Korea

[21] Appl. No.: 665,261

[22] Filed: Mar. 5, 1991

[30] Foreign Application Priority Data

Nov. 6, 1990 [KR] Rep. of Korea .................. 90-17910

[51] Int. Cl.⁵ .............................................. G11C 7/02
[52] U.S. Cl. ............................... 365/206; 365/225.6
[58] Field of Search .............. 365/149, 189.09, 210, 365/225.6, 206, 207, 208

[56] References Cited

U.S. PATENT DOCUMENTS 4,625,300  11/1986  McElroy ...................... 365/207 X
5,062,079  10/1991  Tsuchida et al. ................... 365/210

*Primary Examiner*—Steven Mottola
*Attorney, Agent, or Firm*—Evenson, McKeown, Edwards & Lenahan

[57] ABSTRACT

A dynamic random access memory (DRAM) with low noise characteristics comprises a plurality of memory cells each consisting of a pair of reference memory cells respectively arranged between a word line and a pair of adjacent bit lines. The reference memory cells store signals of opposite levels corresponding to one bit of information. Each of the reference memory cells consists of a capacitor and switching transistor. One end of the capacitor is connected to the collector of the transistor. The other end of the capacitor is connected to one of the pair of bit lines adjacent thereto. The base of the transistor is connected to the word line, and the emitter of the transistor is completed to receive a reference voltage.

6 Claims, 7 Drawing Sheets

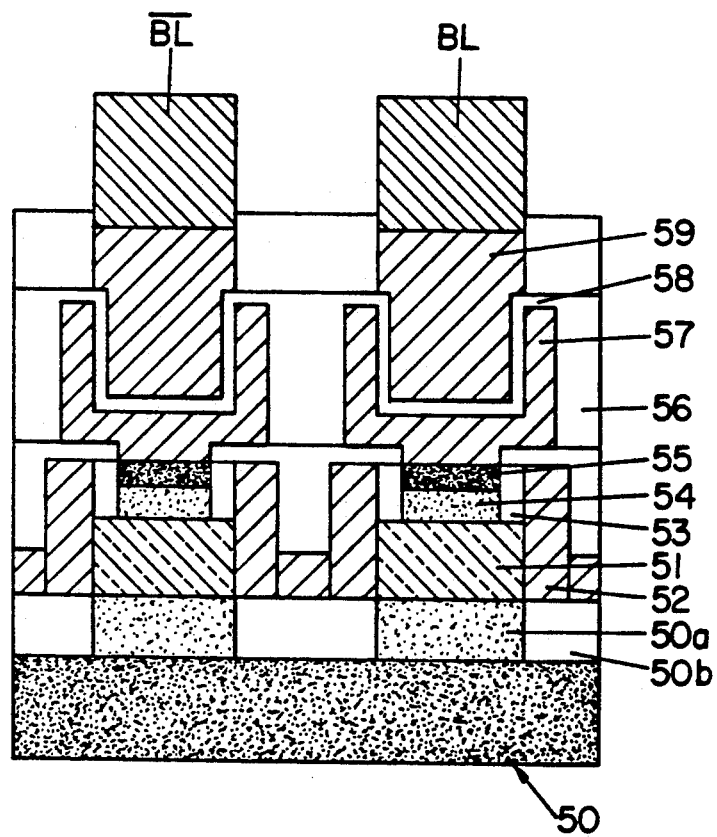

ine type DRAM has been proposed. However, it does not sufficiently eliminate noise. Referring to the folded-bit-line type DRAM illustrated in FIG. 2, there a pair of adjacent bit lines BL0, $\overline{BL0}$ are arranged in parallel. The bit lines BL and $\overline{BL}$ are alternately connected with the reference memory cells MC0, MC1 . . . with reference to each word line orthogonal to the bit lines. The operation is performed in the same manner as in FIG. 1. The reference memory cell consists of a transistor Q and capacitor Cs. In the reference memory cell connected to the bit line, the parasitic capacitance between the bit and word lines is indicated by CBW, while the parasitic capacitance at a cross-over-region crossing area of the bit and word lines not having the reference memory cell is indicated by CBWN.

DYNAMIC RANDOM ACCESS MEMORY WITH LOW NOISE CHARACTERISTICS

FIELD OF THE INVENTION

The present invention relates, in general, to a dynamic random access memory (RAM) and is particularly directed to a DRAM having low noise characteristics.

BACKGROUND OF THE INVENTION

A DRAM is subject to erroneous operation during information storage and retrieval, if the noise level exceeds the level of the information signals.

Noise is usually caused by a transient voltage variation produced during start-up the DRAM, a voltage variation due to alpha-particle radiation produced from the chip package penetrating into the semiconductor material, the voltage variations on the bit lines affected by information stored in a selected memory cell of the memory cell array, that is induced by the parasitic capacitance between the word and bit lines.

The structures of conventional DRAMS, that are considerably affected by such noise are illustrated in FIGS. 1 and 2, which respectively show an open-bit-line and folded-bit-line cell array.

Referring to FIG. 1, a reference memory cell consists of a transistor Q and a capacitor Cs, indicated as MC0, MC1, DM0, DM1, and so on. Namely, the conventional DRAM shown in FIG. 1 is formed by arranging a plurality of reference memory cells, wherein the drain of the MOS transistor Q is connected to the bit line, the gate to the word line, and the source to one end of the capacitor Cs. The other end of the capacitor Cs is provided with a reference voltage Vref. CBW represents the parasitic capacitance between the bit and word lines, and 10 is a sense amplifier.

Such reference memory cells are arranged in the opposite directions of the sense amplifier 10, e.g., differential amplifier, which amplifies the voltage difference between the two bit lines BL0 and $\overline{BL0}$. In operation of this circuit, the charge stored in the capacitor Cs of a selected reference memory cell representing a "0" or "1" bit is retrieved by switching off the transistor by means of a pulse provided through the word line W0, W1, . . . and precharging the bit line BL, $\overline{BL}$, . . . with the reference voltage. In this case, if the word line W1 is chosen, data stored in the capacitors of all the reference memory cells MC1 . . . connected to the word line are transferred through each of the bit lines to the sense amplifier. The sense amplifier senses the slight voltage variation of the bit lines caused by the bit values applied to each of the bit lines, since the bit lines are precharged with the reference voltage. Namely, the sense amplifier amplifies the difference between the selected bit line BL0, BL1, . . . precharged and the unselected bit line $\overline{BL0}$, $\overline{BL0}$, . . . precharged.

Thus, when there occurs a voltage variation in each of the bit lines, the parasitic capacitance CBW between the bit lines causes a variation in the voltage of the unselected word line, so that noise is introduced into the selected bit line, so as to cause the DRAM to operate erroneously. In this case, the magnitude of the noise increases with an increase in the parasitic capacitance CBW. A typical example of such a conventional DRAM is disclosed in the U.S. Pat. No. 4,044,340.

In order to decrease the cell array noise inherently produced in an open-bit-line type DRAM, a folded-bit- However, this DRAM suffers from cell array noise corresponding to the difference between the parasitic capacitances CBW and CBWN in the bit lines BL0, $\overline{BL0}$ connected to the two input terminals of the sense amplifier 10, when there is a voltage variation in each of the bit lines. Such conventional DRAMS are disclosed in the U.S. Pat. Nos. 3,876,992, 3,979,734 and 4,190,466.

In brief, the conventional open-bit-line type DRAM suffers from cell array noise, so that it operates erroneously, because the reference memory cells are formed at crossed-over-regions of the bit and word lines in opposite directions of the sense amplifier. For example, when information bit stored in the capacitor of the memory cell connected to the lowest bit line in one word line of the cell array is a "0", and information bits of all the other capacitors are "1" bits, the data of the lowest bit line, corresponding to a "0" information bits, tends to erroneously increase towards "1".

In addition although the conventional folded-bit-line type DRAM suffers lower cell array noise than the open-bit-line DRAM because of a pair of bit lines being connected in parallel in one side of the sense amplifier, it erroneously operates in the case of the noise of the transient voltage variation and/or the noise of the alpha-particles occurring simultaneously, because the bit lines are alternately connected to one of the memory cells with reference to the word lines.

SUMMARY OF THE INVENTION

An object of the present invention is to provide a DRAM with low noise characteristics, wherein noise caused by internal and external factors, that are introduced into a pair of bit lines connected to a differential amplifier, are counterbalanced with each other.

According to the present invention, a dynamic random access memory (DRAM) with low noise characteristics comprises a plurality of memory cells, each consisting of a pair of reference memory cells respectively arranged between a word line and a pair of adjacent bit lines. The reference memory cells store signals of opposite levels corresponding to one information bit. Each of the reference memory cells consists of a capacitor and a switching transistor. One end of the capacitor is connected to the collector of the transistor, and the other end is connected to one of the pair of bit lines adjacent thereto. The base of the transistor is connected to the word line, and the emitter of the transistor is coupled a reference voltage.

Specifically, a novel aspect of the structure of the inventive DRAM consists in employing two reference memory cells for storing one information bit, compared to the conventional DRAM employing one reference memory cell for storing an information bit of "0" or "1".

The present invention will now be described more specifically with reference to the drawings attached only by way of example.

BRIEF DESCRIPTION OF THE DRAWINGS

FIG. 5b illustrates a cross sectional view of the DRAM shown in FIG. 4;

DETAILED DESCRIPTION

Figure 1:
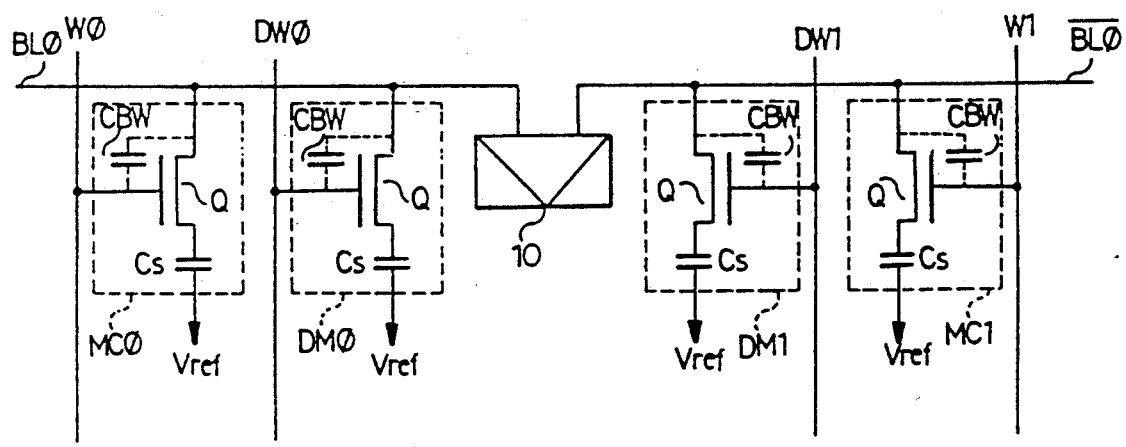
FIG. 1 shows a part of the cell array of a conventional open-bit-line type DRAM.
Figure 2:
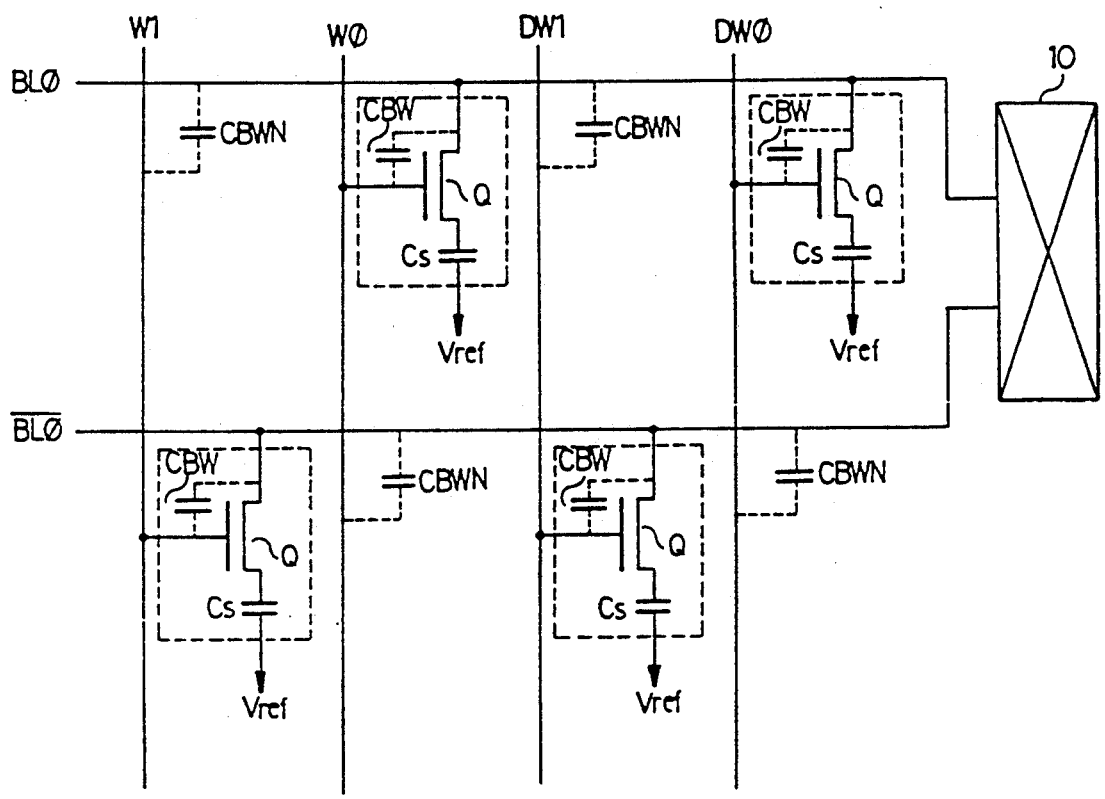
FIG. 2 shows a part of the cell array of a conventional folded-bit-line type DRAM.
Figure 3:
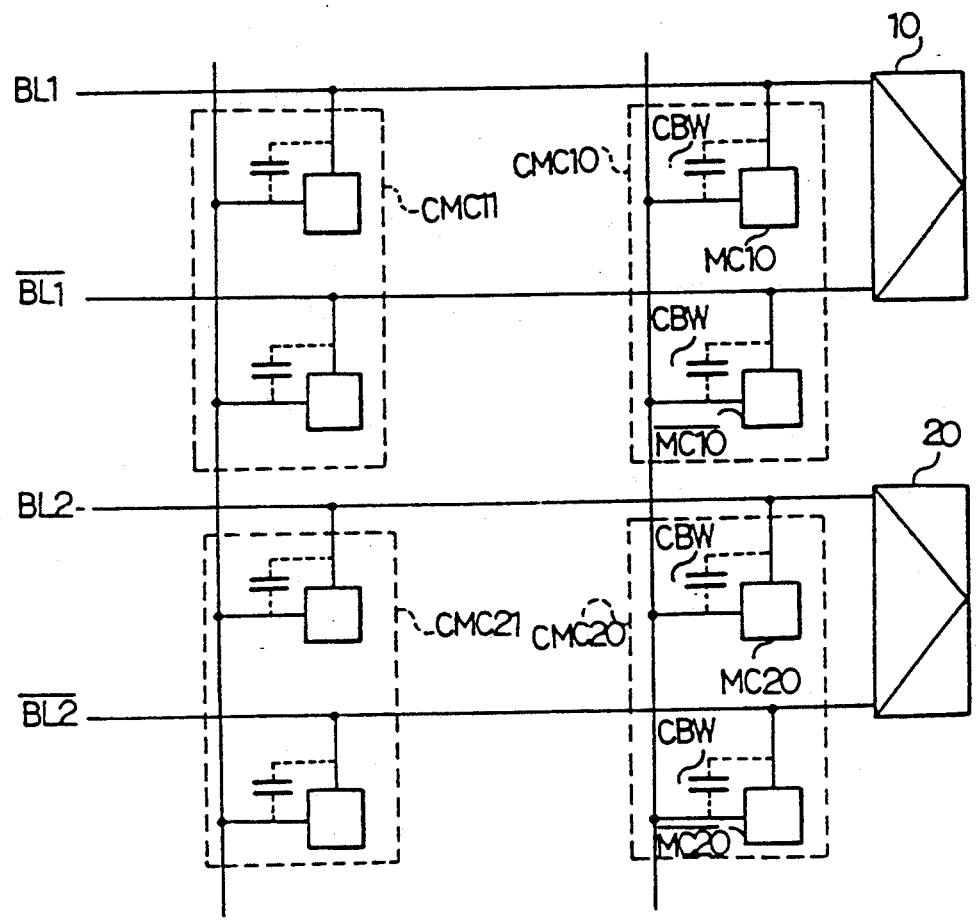
FIG. 3 shows a part of the cell array of the inventive DRAM.

Referring to FIG. 3, two adjacent parallel bit lines BL1 and $\overline{BL1}$ are connected to one side of a sense amplifier 10, and a reference memory cell MC10, $\overline{MC10}$, ... is formed in the crossing areas or cross-over regions of the bit lines BL1, $\overline{BL1}$ and the word lines WL1, WL2, ....

A pair of the reference memory cells, respectively formed in the two adjacent bit lines connected to the sense amplifier 10, will be referred to as a memory cell unit or coupled-bit-line memory cell. The memory cell unit CMC10 consists of two reference memory cells MC10, $\overline{MC10}$.

Hence, the inventive memory device comprises two reference memory cells provided in a pair of the bit lines connected to each of the sense amplifiers 10, 20, ..., each of which reference memory cells is arranged in the crossing area of the word and bit lines.

The reference memory cells used in the inventive DRAM have all the same characteristics. Namely, just as the reference memory cells CMC10, CMC11 are arranged in the crossing area of a pair of bit lines BL1, $\overline{BL1}$ connected in one direction of the sense amplifier and the word lines WL1, WL2, ..., the reference memory cells CMC20, CMC21, ... are provided in the crossing area of a pair of bit lines BL2, $\overline{BL2}$, ... connected to the sense amplifier 20 and the word lines WL1, WL2, ... and so on. The reference numeral CBW represents the parasitic capacitance between the bit and word lines.

According to the present invention, the two reference memory cells of the memory cell unit simultaneously store the information of two opposite levels corresponding to one bit, which information is stored and retrieved by the sense amplifier as follows.

In order to write a "1" data into the memory cell unit CMC10, the word line WL1 is first selected, so as to store the high level voltage Vdd and low level voltage Vss respectively into the reference memory cells MC10 and $\overline{MC10}$ of the memory cell unit CMC10. On the contrary, in order to write a "0" data into the memory cell CMC10, the low and high level voltages Vss and Vdd are respectively stored into the reference memory cells MC10 and $\overline{MC10}$.

On the other hand, in order to retrieve the data from the memory cell unit CMC10, the corresponding word line WL1 is selected, as in the conventional data retrieving process, so as to cause the sense amplifier 10 to sense and amplify the potential variation of the bit lines BL1, $\overline{BL1}$ applying the stored signals from the reference memory cells MC10, $\overline{MC10}$. In this case the bit lines BL1 and $\overline{BL1}$ are provided with the opposite data stored in the reference memory cells MC10 and $\overline{MC10}$, so that the potential variations in the two bit lines have opposite polarity.

Even if noises caused by a transient voltage variation, alpha-particles and cell array when there is a potential variation in the bit lines BL1 and $\overline{BL1}$, since the reference memory cells with the same characteristics are diametrically arranged in the bit lines BL1 and $\overline{BL1}$, the noise introduced into the reference memory cells and the cell array noise are introduced simultaneously into the bit lines BL1 and $\overline{BL1}$ with the same magnitude. Hence, the sense amplifier for sensing and amplifying the voltage difference between the bit lines BL1 and $\overline{BL1}$ is prevented from erroneous operation, sense noise signals introduced into the bit lines BL1 and $\overline{BL1}$ with the same magnitude are counterbalanced by each other, so as to lower the magnitude of the resultant noise.

In a conventional DRAM, one of the two input terminals of the sense amplifier connected with a pair of bit lines BL0 and $\overline{BL0}$ receives a reference voltage, and the other a voltage that is slightly higher or lower than the reference voltage, depending on the data stored in the memory cell. Assuming such a voltage difference to be dV, the inventive memory cell will tolerate 2dV, thus improving its noise characteristics. For example, the bit lines BL1 and $\overline{BL1}$ connected to the pair of reference memory cells MC10 and $\overline{MC10}$ of the inventive memory cell suffer a potential variation of opposite polarity, so that the resistance against the noise introduction is improved since 2dV is greater than dV.

In the present invention, because all reference memory cells have the same characteristics, a voltage variation produced in each of the bit lines of all the memory cells connected to a selected word line will be introduced through the word line into a selected pair of the adjacent bit lines, so as to counterbalance the noise. In addition the noise corresponding to the magnitude of the parasitic capacitance CBW induced in the bit lines BL and $\overline{BL}$ is introduced into the bit lines BL and $\overline{BL}$ during the sense and amplifying operation of the sense amplifier, so as to be equally divided, so that the equally divided noise signals counterbalance each other, thus resulting in a DRAM of considerably improved noise characteristics.

Thus, the inventive DRAM is prevented from erroneous operation even if external noise signals caused by the alpha-particles and transient voltage variations are introduced, since the introduced noises signals are equally divided into a pair of bit lines, and are counterbalanced in the sense amplifier.

Figure 4:
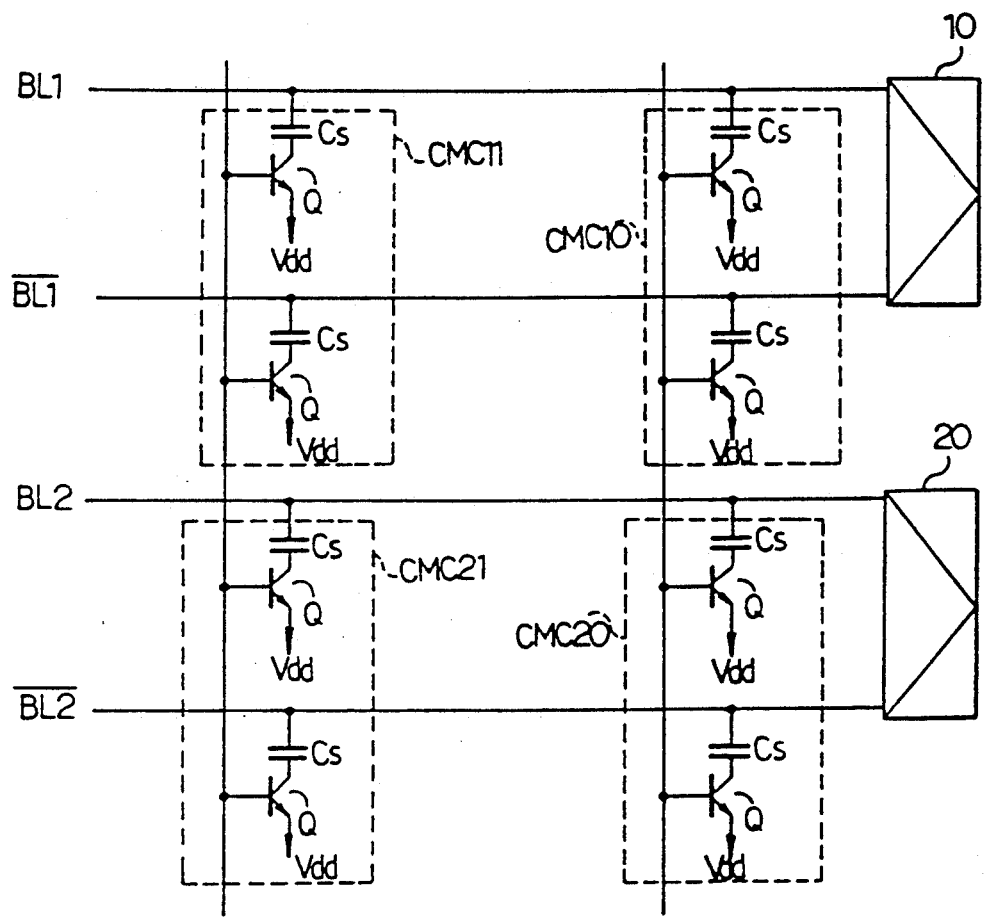
FIG. 4 shows a part of the cell array of a DRAM according to an embodiment of the present invention comprising bipolar transistors.

Referring to FIG. 4, the transistor of the reference memory cell is a bipolar transistor. Each of the two reference memory cells MC10 and $\overline{MC10}$ forming the memory cell unit CMC10 consists of a bipolar transistor Q and storage capacitor Cs. Each of the reference memory cells employs a bipolar transistor as a switching transistor Q.

One terminal of the capacitor Cs is connected to the collector of the transistor, and the other to the bit line. The base of the transistor is connected to a word line, and the emitter receives the highest voltage Vdd of the sense amplifier, so as to prevent a loss of the charge stored in the reference memory cell. Two memory cells of such construction are connected through a word line to the base of each transistor, so as to constitute a memory cell unit.

A bipolar transistor is used a the switching transistor in the reference memory cell is to carry out the storage and retrieving of data at a high switching speed.

Figure 5A:
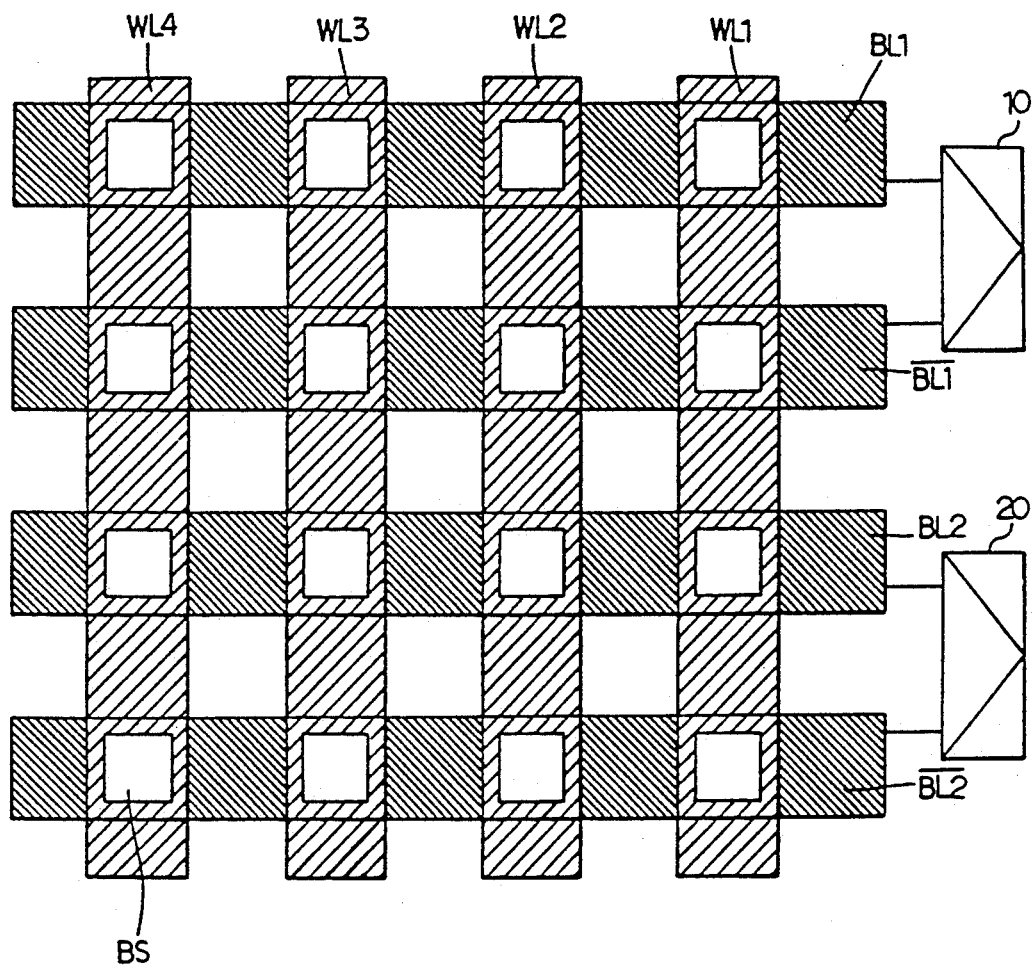
FIG. 5a illustrates the plane structure of the DRAM shown in FIG. 4.

Referring to FIG. 5a, 10 and 20 represent sense amplifiers, BL1, $\overline{BL1}$,.... bit lines, WL1 to WL4 word lines, and BS a bipolar transistor active layer and storage capacitor layer.

The inventive memory cell unit comprises the bit lines BL1 and $\overline{BL1}$ connected adjacent to the two input terminals positioned on one side of the sense amplifier, the bit and word lines orthogonally crossing each other, and a bipolar transistor of vertical structure arranged in each of the crossing areas of the bit and word lines.

In order to construct the inventive memory cell unit, the storage capacitor must be vertically placed on the bipolar transistor, which structure is shown in FIG. 5b.

The structure of the bipolar transistor comprises an N+ type substrate 50 serving as the emitter, a P− type silicon 51 serving as the base, an N+ silicon 55 serving as the collector, an N− silicon 50a and a field oxide 50b formed on the N+ type substrate, word line 52 formed by P type polysilicon, an oxide spacer 53, and N− silicon 54 and N+ silicon 55 successively formed over the P− silicon 51.

The storage capacitor is formed on the N+ silicon of the collector of the transistor, and comprises storage node 57, dielectric material 58 and N type polysilicon plate 59.

Reference numerals BL and $\overline{BL}$ indicate metal bit lines integrally formed with the plate 59 of the capacitor.

Figure 6:
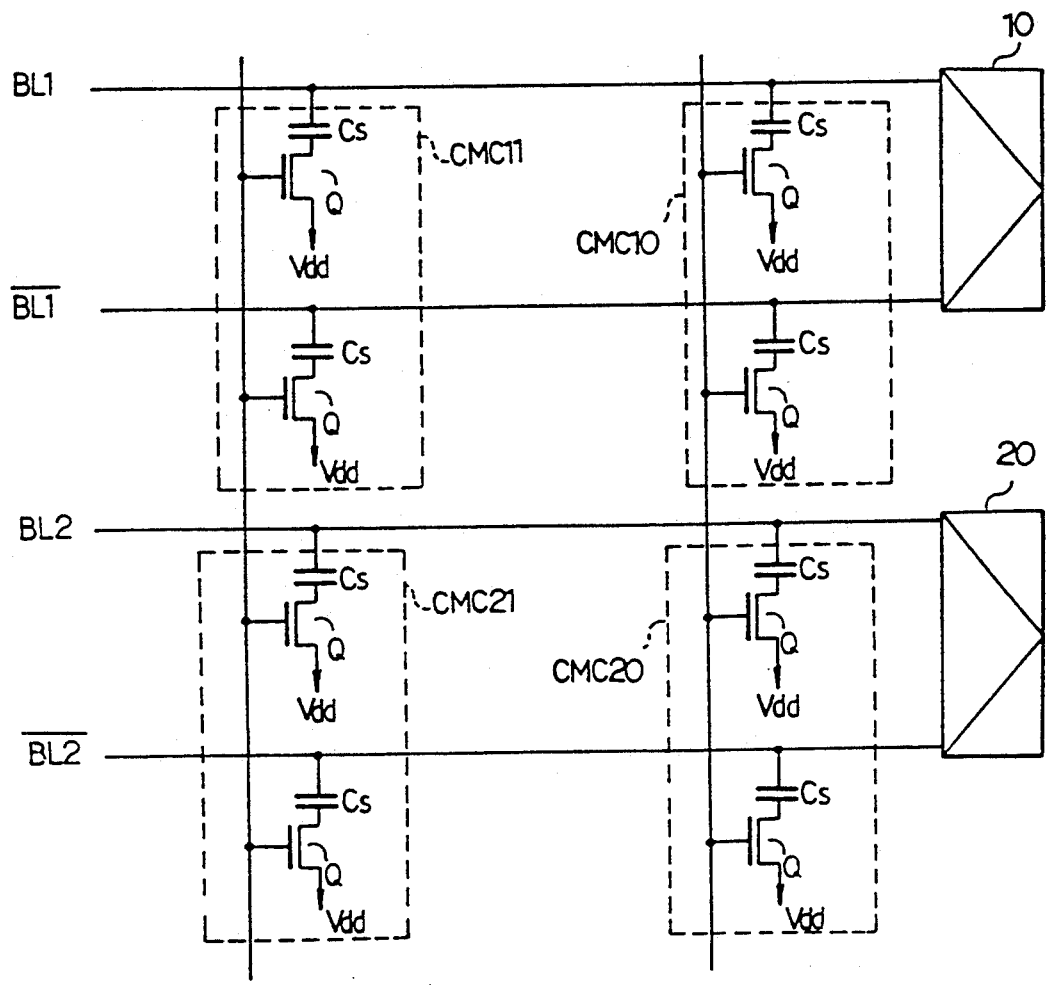
FIG. 6 shows a part of the cell array of a DRAM according to another embodiment of the present invention comprising MOS transistors.

Referring to FIG. 6, the switching transistor of the reference memory cell is comprised of a MOS transistor, in order to lower power consumption and improve integrity. In this case, the structure of the DRAM is the same as the structure of FIG. 4 except that a MOS transistor used as the switching transistor, in place of a bipolar transistor.

As described above, the two reference memory cells of the same characteristics are employed as one memory cell unit for storing and retrieving one bit data, so that the noise induced from other memory cells affects the two reference memory cells, and therefore the equally divided noise signals are counterbalanced by the differential amplifier, thus reducing noise caused by array noise, transient voltage variations, etc. so as to prevent erroneous operation of the DRAM.

It will be readily appreciated by one skilled in the art that various embodiments of the present invention may be obtained without departing the spirit of the present invention.

What is claimed is:

1. A DRAM (dynamic random access memory) with low noise characteristics, said memory comprising:
   a plurality of memory cells, each memory cell serving as one bit and consisting of a pair of reference memory cells respectively arranged between a word line and a pair of adjacent bit lines, each one of said pair of reference memory cells being driven by the word line;
   said reference memory cells storing signals of opposite levels corresponding to said one bit of information; and wherein
   each of said reference memory cells consists of a capacitor and a switching transistor.

2. A DRAM, according to claim 1, wherein said adjacent bit lines are arranged on one side of a sense amplifier.

3. A DRAM, according to claim 1, wherein said switching transistor is a bipolar transistor, such capacitor has one electrode thereof connected to a collector of said switching transistor, and another electrode thereof connected to one of said pair of bit lines adjacent thereto, and wherein said switching transistor has a base connected to said word line, and an emitter coupled to receive a reference voltage.

4. A DRAM, according to claim 1, wherein said switching transistor is metal oxide semiconductor transistor.

5. A DRAM, according to claim 1, wherein said switching transistor and said capacitor are disposed at a cross-over area of said bit and word lines.

6. A DRAM, according to claim 1, wherein said capacitor is formed on a collector of said switching transistor.

* * * * *